(12) United States Patent
Wuebbe

(10) Patent No.: US 9,766,315 B2
(45) Date of Patent: Sep. 19, 2017

(54) METHOD AND MAGNETIC RESONANCE APPARATUS TO ADAPT A SLICE POSITIONING WITHIN A SLICE PROTOCOL FOR A MAGNETIC RESONANCE EXAMINATION

(71) Applicant: Siemens Aktiengesellschaft, Munich (DE)

(72) Inventor: Marcus Wuebbe, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 607 days.

(21) Appl. No.: 14/301,610

(22) Filed: Jun. 11, 2014

(65) Prior Publication Data
US 2014/0361773 A1    Dec. 11, 2014

(30) Foreign Application Priority Data

Jun. 11, 2013    (DE) .................. 10 2013 210 855

(51) Int. Cl.
*G01V 3/00*    (2006.01)
*G01R 33/54*    (2006.01)
*G01R 33/483*    (2006.01)

(52) U.S. Cl.
CPC ....... *G01R 33/543* (2013.01); *G01R 33/4835* (2013.01)

(58) Field of Classification Search
CPC .............. G01R 33/3415; G01R 33/543; G01R 33/5659; G01R 33/36; A61B 5/055
See application file for complete search history.

(56) References Cited

U.S. PATENT DOCUMENTS

| | | | |
|---|---|---|---|
| 2002/0005718 A1 | 1/2002 | Thesen | |
| 2006/0039526 A1* | 2/2006 | Urushiya | G06T 11/005 378/4 |
| 2007/0078624 A1* | 4/2007 | Horita | G01B 11/002 702/167 |
| 2007/0161889 A1 | 7/2007 | Mayer et al. | |
| 2007/0173716 A1 | 7/2007 | Mayer et al. | |

(Continued)

FOREIGN PATENT DOCUMENTS

CN    1843295 A    10/2006

*Primary Examiner* — Walter L Lindsday, Jr.
*Assistant Examiner* — Frederick Wenderoth
(74) *Attorney, Agent, or Firm* — Schiff Harris LLP

(57) ABSTRACT

In a method and magnetic resonance (MR) apparatus for an adaptation of a slice positioning within a slice protocol for an MR examination of a first body region and a second body region of a patient, wherein the two body regions are formed and/or arranged mirror-symmetrical to one another within the patient, the slice protocol for the MR examination is designated, and a manual adaptation of the slice protocol takes place for positioning at least one slice of the MR examination for the first body region by means of at least one first adaptation value. An automatic determination of a second adaptation value is made for positioning of at least one slice of the magnetic resonance examination for the second body region, the determination of the second adaptation value depending on the first adaptation value. An automatic adaptation of the slice protocol of the magnetic resonance examination for the second body region is then made, dependent on the second adaptation value.

6 Claims, 5 Drawing Sheets

(56) References Cited

U.S. PATENT DOCUMENTS

| | | | |
|---|---|---|---|
| 2007/0208248 A1* | 9/2007 | Harvey | G01R 33/54 600/410 |
| 2009/0270868 A1 | 10/2009 | Park et al. | |
| 2011/0116702 A1* | 5/2011 | Bredno | G06T 7/608 382/131 |
| 2012/0084007 A1* | 4/2012 | Tran | G01V 11/00 702/6 |
| 2013/0188852 A1* | 7/2013 | Bakai | G06T 7/0012 382/131 |

* cited by examiner

METHOD AND MAGNETIC RESONANCE APPARATUS TO ADAPT A SLICE POSITIONING WITHIN A SLICE PROTOCOL FOR A MAGNETIC RESONANCE EXAMINATION

BACKGROUND OF THE INVENTION

Field of the Invention

The present invention concerns a method and apparatus to adapt a slice positioning for a magnetic resonance (MR) measurement of two body regions of a patient, wherein the two body regions are formed and arranged so as to be mirror-symmetrical to one another within the patient.

Description of the Prior Art

Before a magnetic resonance examination (data acquisition) of a patient, a measurement protocol and/or slice protocol is initially created for the pending magnetic resonance examination. For this purpose, most often a localization measurement is implemented, from which the position of the patient (in particular of a body region of the patient that is to be examined) is detected within a field of view (FOV) of a magnetic resonance device. Using the data of the localization measurement and additional measurement information, for example which type of tissue should be depicted, etc., the measurement protocol and/or slice protocol for acquiring diagnostic-quality MR data is most often created automatically by a control unit of the magnetic resonance device.

For many magnetic resonance measurements it is necessary that the slice protocol and/or the measurement protocol must be adapted in order to achieve a depiction of the body region to be examined that is as optimal as possible and/or a viewing angle of the body region of the patient that is to be examined that is as optimal as possible. Usually, at least one adaptation value is hereby manually entered by an operator (for example an MTA or a physician) via a user terminal, and the at least one adaptation value establishes and/or displaces a position and/or an orientation and/or additional parameter of individual slices within the slice protocol. If multiple body parts of the patient are examined, the manual input of the adaptation values turns out to be particularly error-prone and time-consuming.

SUMMARY OF THE INVENTION

An object of the present invention is to provide a method and an MR apparatus with which a registration and/or input of adaptation values within a slice protocol for a magnetic resonance examination is facilitated.

The method according to the invention for an adaptation of a slice positioning within a slice protocol for a magnetic resonance examination of a first body region and a second body region of a patient, wherein the two body regions are formed and/or arranged mirror-symmetrical to one another within the patient, has the following steps.

The slice protocol for the magnetic resonance examination is designated. A manual adaptation of the slice protocol for positioning at least one slice of the magnetic resonance examination for the first body region takes place by means of at least one first adaptation value. An automatic determination of a second adaptation value is implemented, for positioning of at least one slice of the magnetic resonance examination for the second body region, wherein the determination of the second adaptation value takes place depending on the first adaptation value. An automatic adaptation of the slice protocol of the magnetic resonance examination for the second body region is implemented by means of the second adaptation value.

The adaptation of the slice protocol, and therefore of the slice positioning, for the second body region of the patient thus can be provided particularly simply and quickly, such that an identical slice configuration and/or an identical section and/or an identical view of the two body regions by means of the magnetic resonance examination can be detected and presented for both body regions. The first body region and the second body region can be of identical design, but at least the two body regions are designed and arranged as mirror images of one another, in particular relative to a plane of symmetry (a sagittal plane, for example) of the human body. The two body regions can respectively include a knee and/or a shoulder and/or a lobe of a lung, etc. In addition, unwanted errors that can occur given a manual adaptation of the slice protocol for the second body region can advantageously be prevented, for example by the second adaptation value being (for example by operation of a control unit, in particular a slice positioning unit) an identical but mirror-symmetrical translation and/or rotation relative to the first adaptation value.

The designation of the slice protocol preferably takes place using a localization measurement that is implemented on the patient before the diagnostic magnetic resonance examination. A slice protocol is automatically determined from the acquired data of the localization measurement for the body region to be examined or for the multiple body regions of the patient that are to be examined. In addition, an optimal positioning of the patient within a field of view (FOV) of the magnetic resonance device can take place based on the data of the localization measurement. The localization measurement is preferably implemented automatically and/or independently by a control unit and/or a slice positioning unit of the magnetic resonance device, and the automatic creation of the slice protocol for the pending magnetic resonance examination also takes place automatically and/or independently by the control unit and/or the slice positioning unit. For example, the number of slices and/or an arrangement of the individual slices within the body region and/or a thickness of the individual slices and/or additional parameters and/or information that are considered to be reasonable to those skilled in the art are established within the slice protocol. The input of the at least one first adaptation value can take place within a matrix, wherein the matrix can have multiple adaptation values that, for example, include a displacement of one or more slice positions and/or a rotation of one or more slice positions.

Furthermore, the at least one first adaptation value includes a displacement and/or a rotation of at least one slice position. An error-free determination of the second adaptation value that can be provided particularly quickly, in particular given a change—caused by the adaptation value— of a spacing and/or of an orientation of the at least one slice position relative to an imaginary plane of symmetry. A mirror-symmetrical arrangement of the two body regions given the displacement (in particular a lateral displacement) and/or the rotation of the at least one slice position is hereby advantageously automatically taken into account. In addition, input errors that can occur given a manual input of the second adaptation values by a medical operator can hereby advantageously be prevented. An error-free determination of the second adaptation values given a lateral displacement relative to the imaginary plane of symmetry can be achieved via the method according to the invention. As used herein, a "lateral displacement" is a displacement and/or translation of a slice position that causes a change of the distance of the slice position from an imaginary plane of symmetry between the two body regions and/or an angle of a slice relative to the imaginary plane of symmetry. Furthermore, as used herein, a "rotation" is a change of an orientation of a slice in the body region, wherein the change of the orientation takes place relative to the imaginary plane of symmetry.

In an embodiment of the invention, the automatic determination of the second adaptation value includes a mirroring of the first adaptation value with regard to an imaginary plane of symmetry. A particularly fast and error-free determination of the second adaptation value can therefore take place depending on the first adaptation value, since an error-prone manual conversion of the first adaptation values by a medical operator to determine the second adaptation values can advantageously be foregone. In addition, the mirroring of the adaptation value enables that an identical slice configuration with regard to the first body region is provided in the second body region for the pending magnetic resonance measurement. In this context, an "imaginary plane of symmetry" is the sagittal plane of the human body of the patient.

Furthermore, the adapted slice protocol for the two body regions can be stored after an adaptation of the slice protocol for the second body region, so reproducibility of the magnetic resonance measurement can be achieved. The storage of the slice protocol preferably takes place in a memory unit of a slice positioning unit of the magnetic resonance device.

Furthermore, the invention encompasses a magnetic resonance device with a slice positioning unit that is designed to execute the above-described method in order to adapt a slice positioning within a slice protocol for a magnetic resonance examination of a first body region and a second body region. The adaptation of the slice protocol (and therefore of the slice positioning) for the second body region of the patient can therefore be provided particularly simply and quickly so that an identical slice configuration and/or an identical section can be detected and depicted by means of the magnetic resonance examination for both body regions. In addition, unwanted errors that can take place given a manual adaptation of the slice protocol for the second body region can advantageously additionally be prevented, for example in that—by means of the slice positioning unit—the second adaptation value exhibits an identical but mirror-symmetrical translation and/or rotation relative to the first adaptation value.

The invention also encompasses a non-transitory, computer-readable data storage medium encoded with programming instructions, which can be loaded directly into a memory unit of a programmable slice positioning unit of a magnetic resonance apparatus. The programming instructions cause the slice positioning unit to execute the method to adapt a slice positioning for a magnetic resonance examination. Such a realization in software has the advantage that previous control units and/or slice positioning units of magnetic resonance devices can be suitably modified according to the invention in order to initiate an adaptation of a slice positioning according to the invention for a magnetic resonance examination.

DESCRIPTION OF THE PREFERRED EMBODIMENTS

Figure 1:
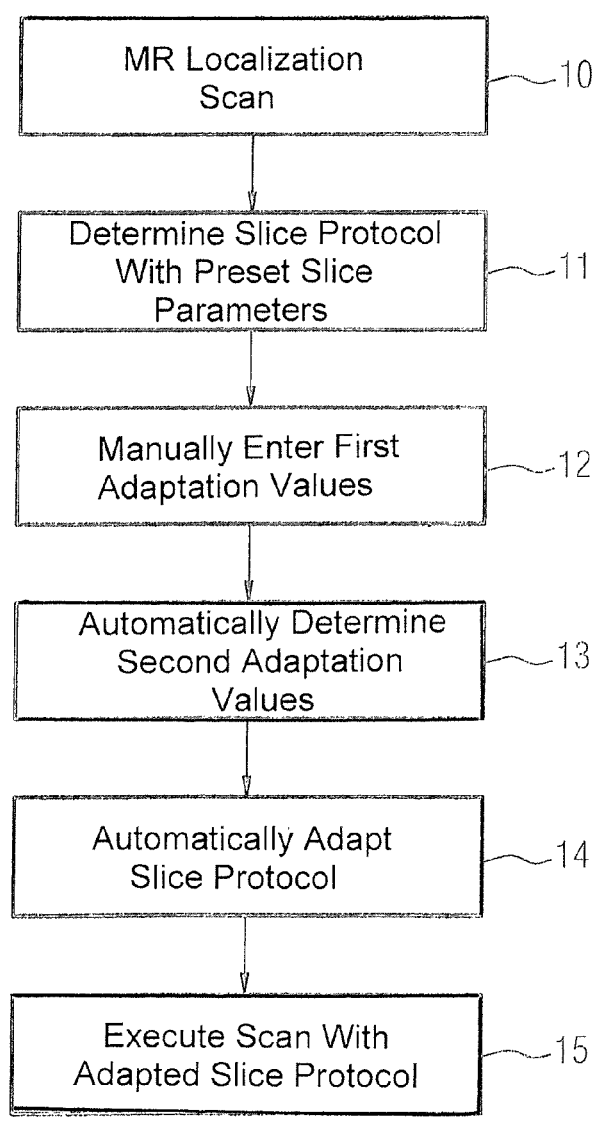
FIG. 1 is a flowchart of the method according to the invention for adaptation of a slice position within a slice protocol for a magnetic resonance measurement.
Figure 5:
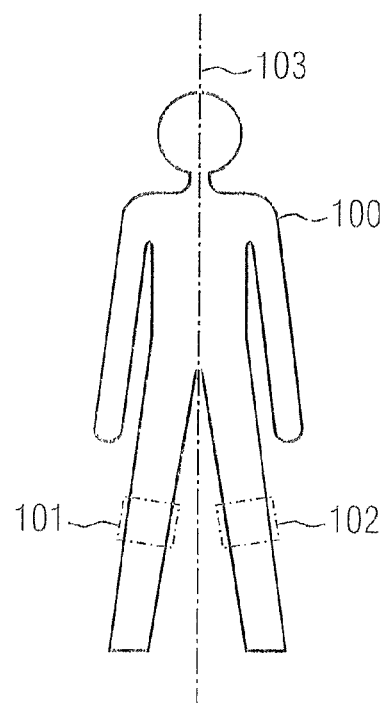
FIG. 5 is a schematic depiction of a patient with a plane of symmetry.

Shown in FIG. 1 is a method according to the invention for adaptation of a slice positioning for a magnetic resonance examination of a first body region 101 and a second body region 102 of a patient 100. The two body regions 101, 102 of the patient 100 are essentially of identical design but are arranged mirror-symmetrical within the patient 100 relative to an imaginary plane of symmetry 103 that (in the present exemplary embodiment) is formed by a sagittal plane of the patient 100. An arrangement of the imaginary plane of symmetry 103 (in particular of the sagittal plane) within the patient 100 is schematically depicted in FIG. 5.

The magnetic resonance examination of the patient 100 takes place by operation of a magnetic resonance apparatus 110 (see FIG. 6), wherein—to execute the method to adapt the slice positioning within a slice protocol for the magnetic resonance examination—the magnetic resonance apparatus 110 has a slice positioning unit 111 and a user terminal 112 that has an input unit 113 (for example a keyboard and/or a computer mouse) and an output unit 114 (in particular a monitor). A medical operator—for example an MTA or a physician—can input corresponding commands and/or parameters by means of the user terminal 112, which commands and/or parameters are required to execute the method to adapt the slice positioning within the slice protocol for the magnetic resonance examination of the first body region 101 and the second body region 102 of the patient 100.

A slice protocol for the pending magnetic resonance measurement is initially registered. For this, in a first method step 10 a localization measurement by means of the magnetic resonance device 110 takes place, wherein a position of the patient 100 and a position of the body regions 101, 102 of the patient 100 that are to be examined are detected by means of the localization measurement. The localization measurement is advantageously implemented automatically and/or independently by means of the slice positioning unit 111 of the magnetic resonance device 110 together with a magnet unit 115 of the magnetic resonance device 110. In a further method step 11, by means of the acquired data of the localization measurement a slice protocol with preset slice parameters is determined automatically and/or independently by the slice positioning unit 111 for the body regions 101, 102 of the patient 100 that are to be examined, wherein additional information (for example an establishment of the body regions that are to be examined and/or an establishment of a tissue type to be examined etc.) is also incorporated into the slice protocol. This information can be input by a medical operator and/or be read out at least in part from a memory unit. The slice protocol that is automatically determined by the slice positioning unit 111 for the pending magnetic resonance examination is stored in a memory unit (not shown in detail) of the slice positioning unit 111.

For an adaptation of the slice protocol, in a further method step 12 the preset slice parameters are presented to the medical operator via the output unit 114. An example of a first body region 101 of the patient 100 is presented with the preset slice parameters in FIG. 2. In the present exemplary embodiment, this first body region 101 of the patient 100 is formed by a knee. However, in principle it is also conceivable that the first body region 101 has a form other than a knee, for example is an arm and/or a shoulder etc. of the patient 100.

Figure 2:
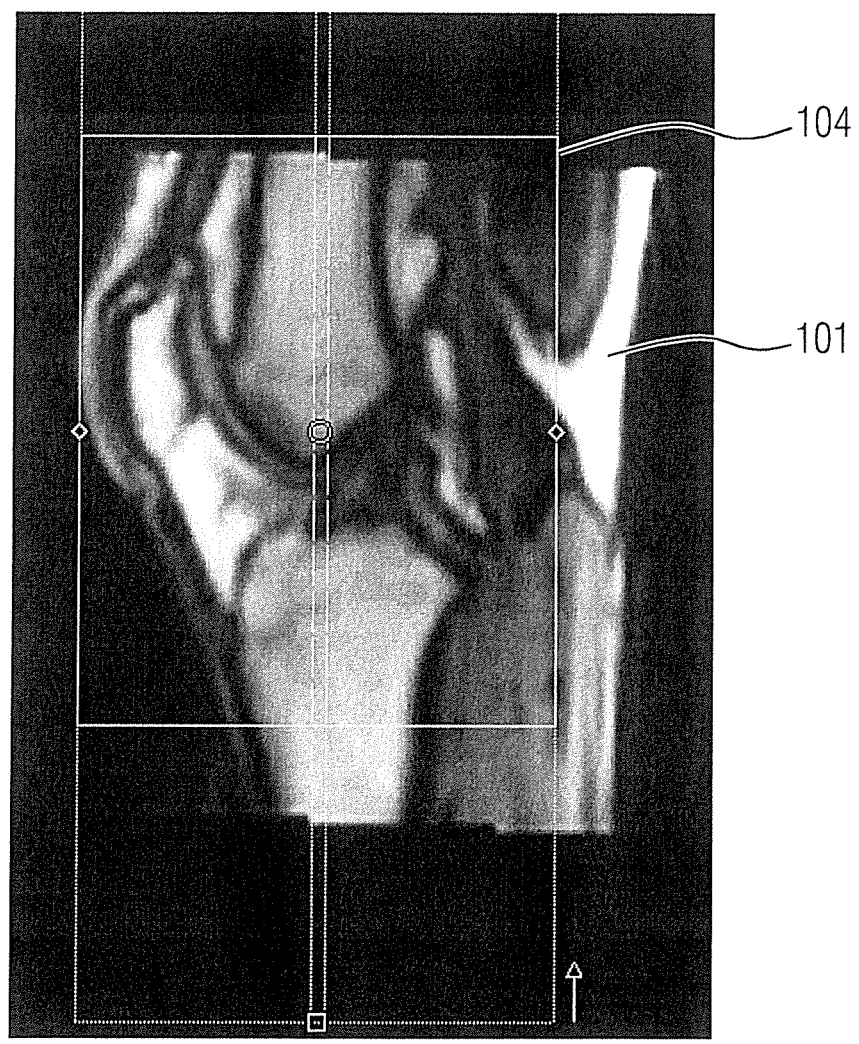
FIG. 2 is a view of a first body region with a preset slice position.

In FIG. 2, the region of the knee of the patient 100 that is encircled with the solid line represents a slice window 104 that includes the region of the knee that should be acquired and depicted by means of individual slice images during the magnetic resonance examination. In a middle region, two dashed lines are shown within the encircled region. These two dashed lines mark a bearing and an orientation of a middle slice for the pending magnetic resonance examination.

In order to adapt a position and/or a bearing and/or an orientation of the preset slice window 104 and/or of the preset individual slices to a position and/or a bearing and/or an orientation of the preset slice window 104 and/or of the preset individual slices that is/are desired and/or ideal for the pending magnetic resonance examination, a manual adaptation of the preset slice protocol for positioning of the slice window 104 and/or of the individual slices of the magnetic resonance examination for the first body region 101 of the patient 100 initially takes in method step 12 (FIG. 1). At least one adaptation value is manually entered by the medical operator as an input to (or via) the input unit 113 of the user terminal 112. Multiple adaptation values can also be input depending on the change of a bearing and/or orientation and/or position of the slice window 104 and/or of the individual slices. The individual adaptation values can be entered and/or stored in a matrix.

Figure 3:
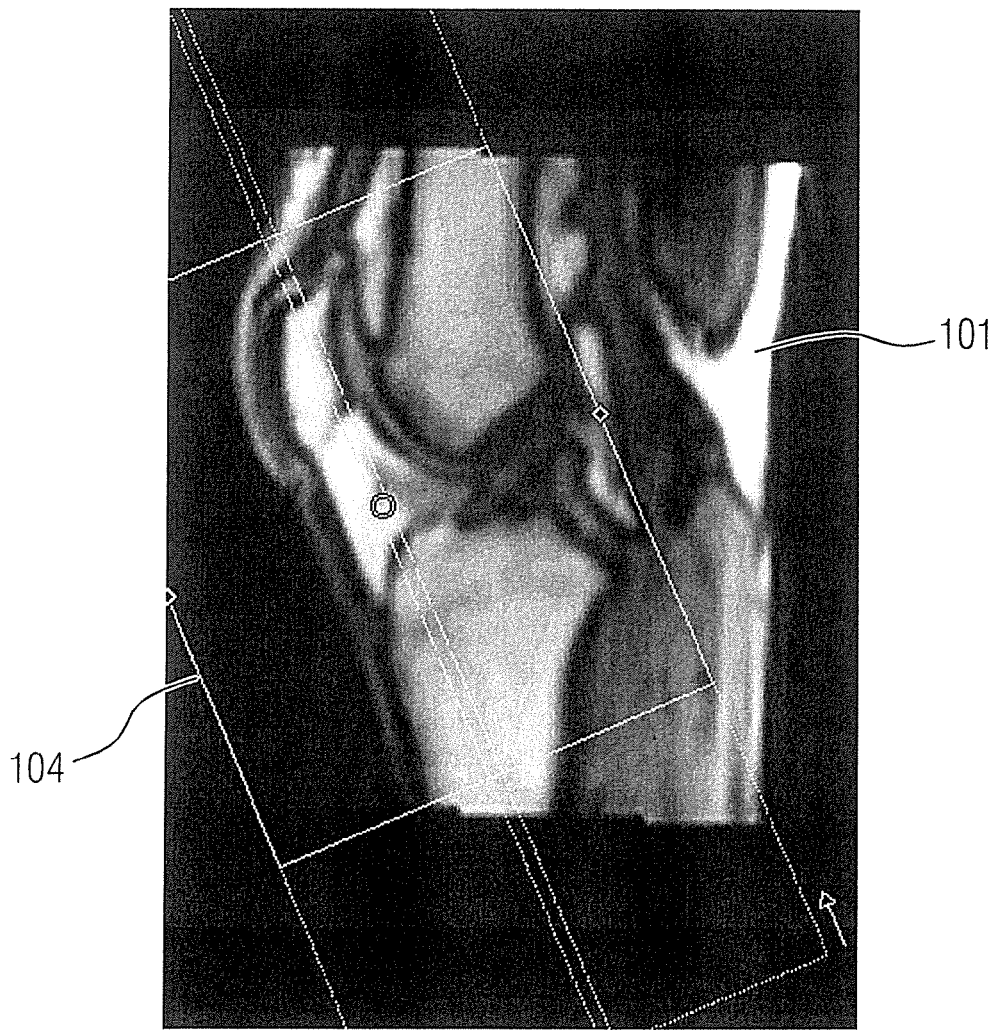
FIG. 3 is a view of the first body region with the adapted slice position.
Figure 4:
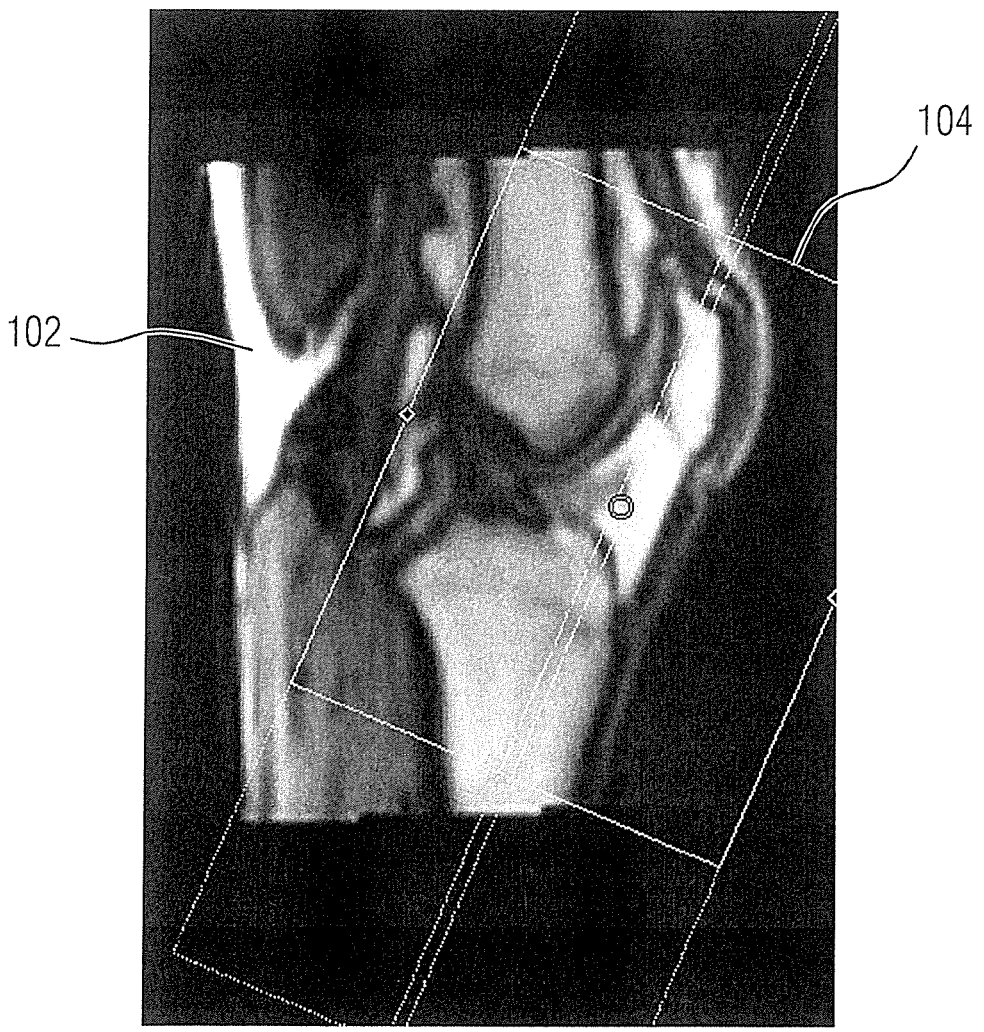
FIG. 4 is a view of a second body region with an adapted slice position.

These adaptation values can include a displacement and/or a rotation of the slice window 104 and/or a displacement and/or rotation of individual slice positions. In the present exemplary embodiment, the adaptation values include a displacement and/or a rotation of the slice window 104, and therefore also a displacement and a rotation of the individual slices (FIG. 2 through 4). In the present exemplary embodiment, the displacement includes a change of a spacing of the individual slice positions relative to the imaginary plane of symmetry 103 (FIGS. 3 and 5). A storage of the first adaptation values additionally takes place in method step 12. The first body region with the adapted slice positions after an input of the first adaptation values is presented in FIG. 3.

Following this, in a further method step 13 second adaptation values are determined for positioning of slices of the magnetic resonance examination in the second body region 102. The determination of the second adaptation values takes place automatically and/or independently by means of the slice positioning unit 111. The second adaptation values are hereby determined by the slice positioning unit 11 depending on the first adaptation values, wherein for this the second adaptation values essentially correspond to a mirroring (in particular a mirroring around a plane of symmetry) of the first adaptation values relative to the imaginary plane of symmetry 103.

In a further step 14, the slice protocol for the magnetic resonance examination of the second body region 102 is adapted automatically and/or independently by the slice positioning unit using the determined second adaptation values (FIG. 1). The slice protocol for the magnetic resonance examination of the two body regions 101, 102 is subsequently stored in the memory unit of the slice positioning unit 111. The second body region 102 with the adapted slice positions is shown in FIG. 4.

Following this, the magnetic resonance examination of the patient 100 takes place in a further method step 15 by means of the adapted slice protocol.

The slice positioning unit 111 has a corresponding software and/or computer programs for an automatic execution of the method for adaptation of the slice positioning within the slice protocol for the magnetic resonance examination of the two body regions 101, 102. These software and/or computer programs are stored in the memory unit (not shown in detail) of the slice positioning unit 111 and are executed at a processor of said slice positioning unit 111. The software and/or the computer programs have program means that execute the method to adapt the slice positioning for the magnetic resonance examination of both body regions 101, 102.

Figure 6:
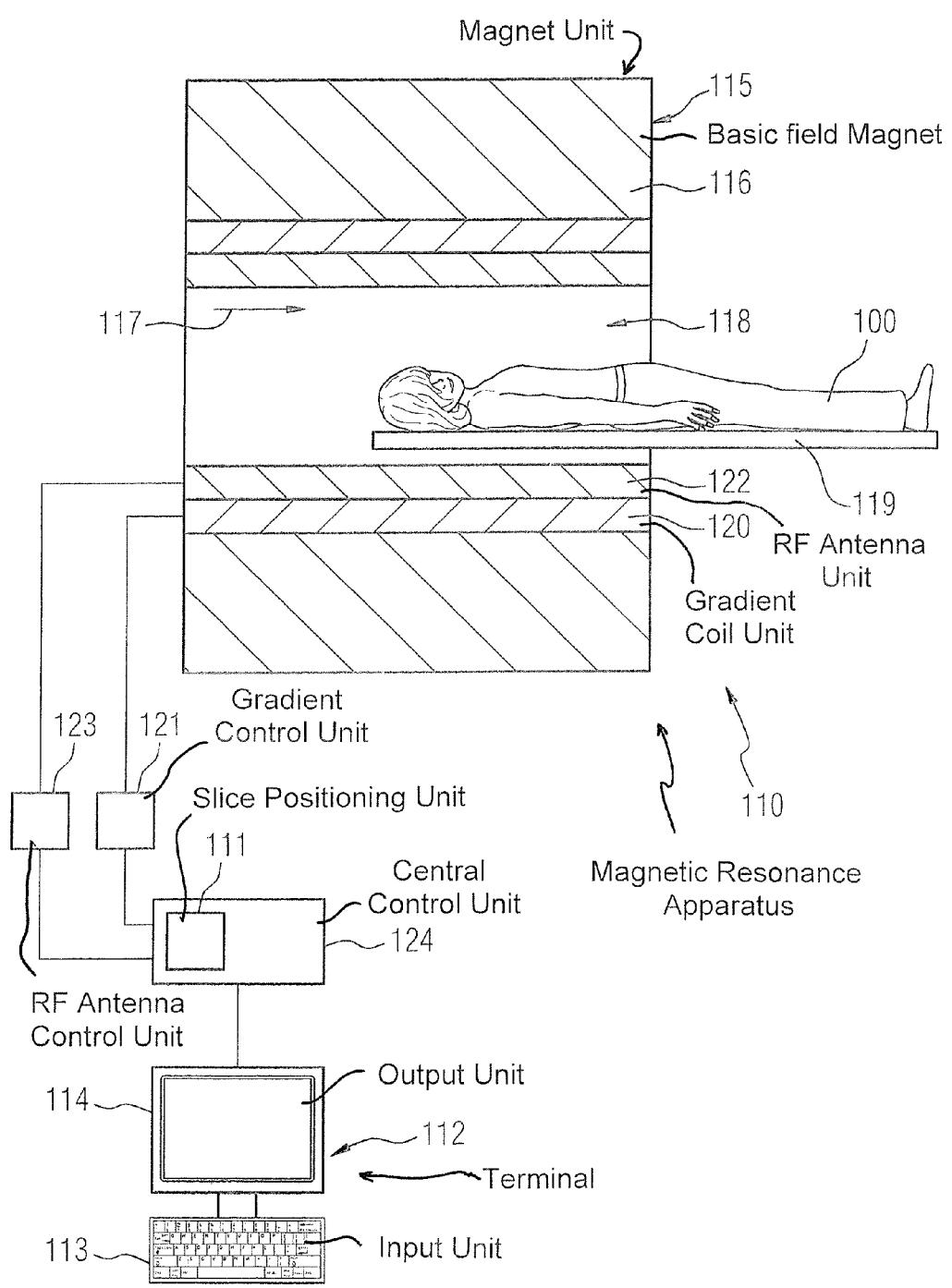
FIG. 6 schematically illustrates a magnetic resonance device according to the invention.

The magnetic resonance apparatus 110 is schematically depicted in FIG. 6. The magnetic resonance apparatus 110 has a magnet unit 115 with a basic field magnet 116 to generate a strong and in particular constant basic magnetic field 117. In addition, the magnetic resonance apparatus 110 has a cylindrical patient accommodation region 118 to accommodate the patient 100, wherein the patient accommodation region 118 is surrounded by the magnet unit 115 in the shape of a cylinder in a circumferential direction. For a magnetic resonance examination, the patient 100 is moved (by a patient support device 119 of the magnetic resonance apparatus 110) into the patient accommodation region 118. For this purpose, the patient support device 119 is mounted so as to be moveable within the patient accommodation region 118.

Furthermore, the magnet unit 115 has a gradient coil unit 120 to generate magnetic field gradients, which gradient coil unit is used for a spatial coding during an imaging. The gradient coil unit 120 is controlled by a gradient control unit 121. Furthermore, the magnet unit 116 has a radio-frequency (RF) antenna unit 122 operated by a radio-frequency antenna control unit 123 to excite (deflect) nuclear spins in the patient from the polarization state that is produced by the basic magnetic field 117 generated by the basic field magnet 116. The radio-frequency antenna unit 122 is controlled by the radio-frequency antenna control unit 123 and emits radio-frequency pulses, in a magnetic resonance data acquisition sequence, into an examination space (which is essentially formed by the patient accommodation region 118).

To control the basic magnet 116, the gradient control unit 121 and the radio-frequency antenna control unit 123, the magnetic resonance device 110 has a central control unit 124 formed by a computer. The control unit 124 centrally controls the magnetic resonance device 110, for example the implementation of a predetermined imaging gradient echo sequence. In the exemplary embodiment, the slice positioning unit 111 is integrated into the central control unit 124. In principle, however, a design of the slice positioning unit 111 separate from the central control unit 124 of the magnetic resonance device 110 is conceivable without departing from scope of the invention.

The shown magnetic resonance apparatus 110 naturally can have additional components that are conventional. The general functionality of the magnetic resonance apparatus 110 (other than the inventive features described above) is known to those skilled in the art, such that a detailed description thereof is not necessary herein.

Although modifications and changes may be suggested by those skilled in the art, it is the intention of the inventor to embody within the patent warranted hereon all changes and modifications as reasonably and properly come within the scope of his contribution to the art.

I claim:

1. A method for adaptation of a slice positioning within a slice protocol for a magnetic resonance examination of a first body region and a second body region of a patient, said first and second body regions being mirror-symmetrical to each other within the patient with respect to a plane of symmetry, said method comprising:
   designating the slice protocol for the magnetic resonance examination in a computerized processor;
   via an input unit of said computerized processor, making a manual entry of at least one first adaptation value that adapts said slice protocol in order to position at least one slice of the magnetic resonance examination in the first body region;
   automatically determining, in said processor, a second adaptation value as a mirroring of said first adaptation value with respect to said plane of symmetry within the patient in order to position at least one slice of the magnetic resonance examination in the second body region;
   in said processor, automatically adapting the slice protocol of the magnetic resonance examination for the second body region dependent on said second adaptation value; and
   from said processor, making the adapted slice protocol available in an electronic form configured to operate a magnetic resonance apparatus so as to implement said magnetic resonance examination with the adapted slice protocol.

2. A method as claimed in claim 1 comprising entering said at least one first adaptation value in a form that designates a displacement of said at least one slice position in said first body region.

3. A method as claimed in claim 1 comprising entering said at least one first adaptation value in a form that designates a rotation of said at least one slice position in said first body region.

4. A method as claimed in claim 1 comprising storing the adapted slice protocol for said first and second body regions in an electronic memory, after adapting the slice protocol for the second body region.

5. A magnetic resonance apparatus comprising:
   a magnetic resonance data acquisition scanner;
   a control computer configured to operate the magnetic resonance data acquisition scanner in order to execute a magnetic resonance examination, according to a slice protocol, to acquire data from respective slices in a first body region and respective slices in a second body region of a patient situated in the magnetic resonance data acquisition unit, said first and second body regions being mirror-symmetrical to each other within the patient with respect to a plane of symmetry;
   said control computer comprising an input interface configured to receive at least one manually-entered first adaptation value that adapts the slice protocol in order to position at least one of said slices in said magnetic resonance examination in said first body region;
   said control computer comprising a computerized slice positioning processor configured to automatically determine a second adaptation value as a mirroring of said first adaptation value with respect to said plane of symmetry within the patient in order to position at least one of said slices in said magnetic resonance examination in said second body region;
   said slice positioning processor being configured to automatically adapt the slice protocol of the magnetic resonance examination for the second body region dependent on said second adaptation value; and
   said slice positioning processor being configured to provide the adapted slice protocol to said control computer, and said control computer being configured to operate said magnetic resonance data acquisition scanner so as to execute said magnetic resonance examination according to the adapted slice protocol.

6. A non-transitory, computer-readable data storage medium encoded with programming instructions, said storage medium being loaded into a control and processing computer of a magnetic resonance apparatus, that also comprises a magnetic resonance data acquisition scanner, said programming instructions causing said computerized control and evaluation computer to:
   receive a designation of a slice protocol in order to operate said magnetic resonance data acquisition scanner to execute a slice protocol to acquire magnetic resonance data in a magnetic resonance examination of a first body region and a second body region of a patient situated in the magnetic resonance data acquisition unit, said first and second body regions being mirror-symmetrical to each other within the patient with respect to a plane of symmetry;
   receive a manual entry of at least one first adaptation value that adapts said slice protocol in order to position at least one slice of the magnetic resonance examination in the first body region;
   determine a second adaptation value as a mirroring of said first adaptation value with respect to said plane of symmetry within the patient in order to position at least one slice of the magnetic resonance examination in the second body region;
   adapt the slice protocol of the magnetic resonance examination for the second body region dependent on said second adaptation value; and
   make the adapted slice protocol available in an electronic form configured to operate a magnetic resonance apparatus so as to implement said magnetic resonance examination with the adapted slice protocol.

* * * * *